(12) United States Patent
Singerl et al.

(10) Patent No.: US 8,878,622 B2
(45) Date of Patent: Nov. 4, 2014

(54) SYSTEM AND METHOD FOR GENERATING A PULSE-WIDTH MODULATED SIGNAL

(75) Inventors: Peter Singerl, Villach (AT); Christian Vogel, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/081,628

(22) Filed: Apr. 7, 2011

(65) Prior Publication Data

US 2012/0256697 A1 Oct. 11, 2012

(51) Int. Cl.
*H03K 7/08* (2006.01)
*H03F 3/187* (2006.01)
*H03F 3/217* (2006.01)

(52) U.S. Cl.
CPC .......... *H03F 3/217* (2013.01); *H03F 2200/351* (2013.01); *H03F 3/187* (2013.01); *H03K 7/08* (2013.01)
USPC ............................. 332/109; 363/41; 375/238

(58) Field of Classification Search
CPC ... H03F 3/217; H03F 3/187; H03F 2200/351; H03K 7/08
USPC ............................. 332/109; 363/41; 375/238
See application file for complete search history.

(56) References Cited

U.S. PATENT DOCUMENTS

| 4,780,685 | A |   | 10/1988 | Ferguson |
| 5,148,168 | A | * | 9/1992 | Masuda et al. ................. 341/152 |
| 5,256,987 | A |   | 10/1993 | Kibayashi et al. |
| 6,028,485 | A |   | 2/2000 | Sigmon et al. |
| 6,031,481 | A | * | 2/2000 | Craven ........................... 341/200 |
| 6,473,457 | B1 | * | 10/2002 | Pascual et al. ................. 375/238 |
| 6,597,242 | B2 |   | 7/2003 | Petz et al. |
| 6,794,931 | B2 |   | 9/2004 | Kenington |
| 7,548,048 | B2 | * | 6/2009 | Chang ............................ 323/283 |
| 7,843,242 | B1 |   | 11/2010 | Zhao |
| 2003/0210096 | A1 |   | 11/2003 | Pengelly et al. |
| 2006/0001484 | A1 |   | 1/2006 | Paul et al. |
| 2009/0167431 | A1 |   | 7/2009 | Guilherme et al. |
| 2009/0270056 | A1 | * | 10/2009 | Singerl et al. ............... 455/127.1 |
| 2009/0273396 | A1 |   | 11/2009 | Nam et al. |
| 2010/0020108 | A1 |   | 1/2010 | Cho et al. |
| 2010/0079206 | A1 | * | 4/2010 | Song et al. ..................... 330/149 |
| 2010/0085097 | A1 |   | 4/2010 | Bryant |
| 2013/0016795 | A1 |   | 1/2013 | Kunihiro et al. |
| 2013/0070836 | A1 |   | 3/2013 | Singerl et al. |

FOREIGN PATENT DOCUMENTS

| CN | 101261292 A | 9/2008 |
| KR | 2009102412 A | 9/2009 |
| WO | 2011034471 A1 | 3/2011 |
| WO | 2011070952 A1 | 6/2011 |

OTHER PUBLICATIONS

Marco Berkhout and Lutsen Dooper Class-D Audio Amplifiers in Mobile Applications Date: May 2010 IEEE Transactions on circuits and system; vol. 57, No. 5.*

(Continued)

*Primary Examiner* — Arnold Kinkead
*Assistant Examiner* — Richard Tan
(74) *Attorney, Agent, or Firm* — Slater & Matsil, L.L.P.

(57) ABSTRACT

In an embodiment, a method of generating a pulse-width modulated signal from an input signal includes calculating a finite number of basis functions of a first pulse-width modulated signal based on the input signal, and forming an electronic output based on the calculated finite number of basis functions.

25 Claims, 5 Drawing Sheets

(56) References Cited

OTHER PUBLICATIONS

Wilkinson, Ernest J., "An N-Way Hybrid Power Divider," IRE Transactions on Microwave Theory and Techniques, Jun. 1959, pp. 116-118.
Kimball, Donald F., et al., "High-Efficiency Envelope-Tracking W-CDMA Base-Station Amplifier Using GaN HFETs," IEEE Transactions on Microwave Theory and Techniques, vol. 54, No. 11, Nov. 2006, 9 pages.
Lee, Yong-Sub et al., "A High-Efficiency Class-E GaN HEMT Power Amplifier for WCDMA Applications," IEEE Microwave and Wireless Components Letters, vol. 17, No. 8, Aug. 2007, 3 pages.
Xu, Hongtao, et al., "A High-Efficiency Class-E GaN HEMT Power Amplifier at 1.9 GHz," IEEE Microwave and Wireless Components Letters, vol. 16, No. 1, Jan. 2006, 3 pages.
Chi, S., et al., "The Frequency Spectrum of Polar Modulated PWM Signals and the Image Problem," ICECS, 2010, pp. 679-682, IEEE.
Amin, A.M.A., et al., "Exploring Aliasing Distortion Effects on Regularly-Sampled PWM Signals," $3^{rd}$ IEEE Conference on Industrial Electronics and Applications, Jun. 3-5, 2008, pp. 2036-2041, Singapore.
Gwee, B-H., et al., "A Micropower Low-Distortion Digital Class-D Amplifier Based on an Algorithmic Pulsewidth Modulator," IEEE Transactions on Circuits and Systems, Oct. 2005, pp. 2007-2022, vol. 52, No. 10.
Song, Z., et al., "The Frequency Spectrum of Pulse Width Modulated Signals," Jun. 2, 2003, pp. 1-39.
Guinee, R.A., "A Novel Fourier Series Simulation Tool for Pulsewidth Modulation (PWM) in Pulsed Power Systems," Conference Proceedings Applied Power Electronics Conference and Exposition, Feb. 15-19, 1998, pp. 123-128, vol. 1. Cork, Ireland.
Gustavsson, U., et al., "A General Method for Passband Quantization Noise Suppression in Pulsed Transmitter Architectures," IMS 2009, pp. 1529-1532, Stockholm, Sweden.
Santi, S., et al., "Spectral Aliasing Effects of PWM Signals with Time-Quantized Switching Instants," Proceedings of the 2004 International Symposium on Circuits and Systems, May 23-26, 2004, pp. IV-689-IV-692.
Cambareri, "Generation and Characterization PWM Signal to Class-D Amplifiers High Efficiency," Thesis, University of Bologna, Bologna, Italy, 2011, 53 pages. (with Translation).
Phanphaisam et al., "A Simple Synthesis Technique of PWM Signal," Proceedings of the IEEE Asia-Pacific Conference on Circuits and Systems, APCCAS 2006, pp. 1647-1650, 2006.
Chen, et al., "A Polar-Transmitter Architecture Using Multiphase Pulsewidth Modulation," IEEE Transactions on Circuits and Systems, vol. 58, No. 2, Feb. 2011, pp. 244-252.
Zhang, et al., "Analysis of Power Recycling Techniques for RF and Microwave Outphasing Power Amplifiers," IEEE Transactions on Circuits and Systems—II: Analog and Digital Signal Processing, vol. 49, No. 5, May 2002, pp. 312-320.
Liao, et al., "High Efficiency WCDMA Power Amplifier with Pulsed Load Modulation (PLM)" IEEE Journal of Solid-State Circuits, vol. 45, No. 10, Oct. 2010, pp. 2030-2037.
Jeong, et al., "Pulsed Load Modulation (PLM) Technique for Efficient Power Amplification," IEEE Transactions on Circuits and Systems—II: Express Briefs, vol. 55, No. 10, Oct. 2008, pp. 1011-1015.

\* cited by examiner

US 8,878,622 B2

SYSTEM AND METHOD FOR GENERATING A PULSE-WIDTH MODULATED SIGNAL

TECHNICAL FIELD

This invention relates generally to semiconductor circuits and methods, and more particularly to a system and method for generating a pulse-width modulated signal.

BACKGROUND

Pulse-width modulated systems are used to provide high efficiency amplification and transmission in applications that vary widely from low-power consumer audio devices, such as MP3 players, to high power data transmission circuits such as base station transmitters. High efficiency is achieved by minimizing power losses due to bias current within the output stages of an amplifier. For example, in audio applications, a class-D amplifier is used to switch the terminals of a loudspeaker between two supply voltages at a frequency greater than the bandwidth of the desired output signal. Here, high frequency switching energy is filtered by the characteristics of the load circuit, for example, the inductance of the loudspeaker. Similarly, in RF applications, a power amplifier (PA), is driven by a pulse-width modulated signal with a pulse frequency greater than the bandwidth of interest. Out-of-band energy is then filtered using an RF bandpass filter, such as a SAW filter. Because there is a minimal IR drop across the output stage of devices operating in a switched manner, as can be the case when PWM signals are used, dissipated power across the output stages of the devices are minimized and efficiency is improved.

The generation of high dynamic range PWM signals, however, poses a number of challenges. Because the amplitude of the signal is embedded within the timing of a pulse train, jitter and inaccuracies in edge transitions may lead to increased noise and decreased dynamic range. The sampled nature of a PWM system can lead to further reductions in dynamic range due to noise folding and aliasing. This is further exasperated when a PWM signal is upconverted to another frequency, for example, in an RF system. Moreover, the generation of aliasing, images and out of band noise potentially causes adjacent band interference, and is often attenuated using high order filtering.

SUMMARY OF THE INVENTION

In an embodiment, a method of generating a pulse-width modulated signal from an input signal includes calculating a finite number of basis functions of a first pulse-width modulated signal based on the input signal, and forming an electronic output based on the calculated finite number of basis functions.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a pulse-width modulator for use with baseband and RF transmission systems. The invention may also be applied, however, to other types of circuits systems, such as audio systems, communication systems, and other electronic or optical systems that utilize pulse-width modulated signals.

In an embodiment, a discrete-time pulse-width modulated signal is created by calculating a finite number of basis functions representing an output PWM signal. The band limited nature of these basis functions prevent aliasing due to the discrete time nature of the signal, thereby allowing for a high-dynamic range and a low out of band noise floor.

Figure 1A:
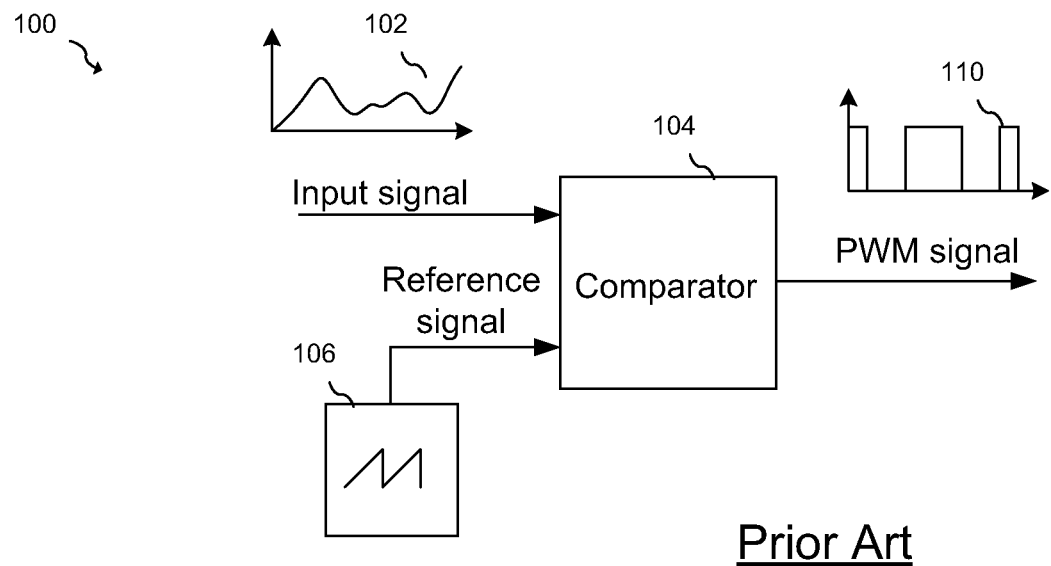
FIGS. 1a-1e illustrate prior art PWM generators and associated spectra.

FIG. 1a illustrates conventional pulse-width modulator 100 that generates PWM signal 110 by using comparator 104 to compare input signal 102 with reference signal 106, for example a ramp signal, to produce PWM output signal 110. Each time the signal level of the input signal crosses the signal level of the reference signal, PWM signal 110 switches its output from one state to another. For example, one state could be a logic 1 representing an output voltage of VDD, and another state could be a logic 0 representing an output voltage of ground. As is known in the art, the pulse-width of output signal 110 can be proportional to the amplitude of input signal 102.

Figure 1B:
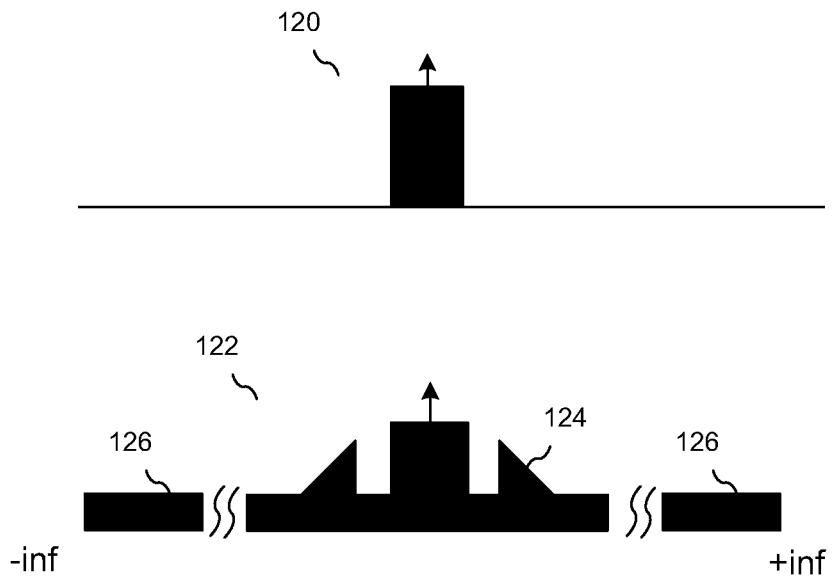
Figure 1C:
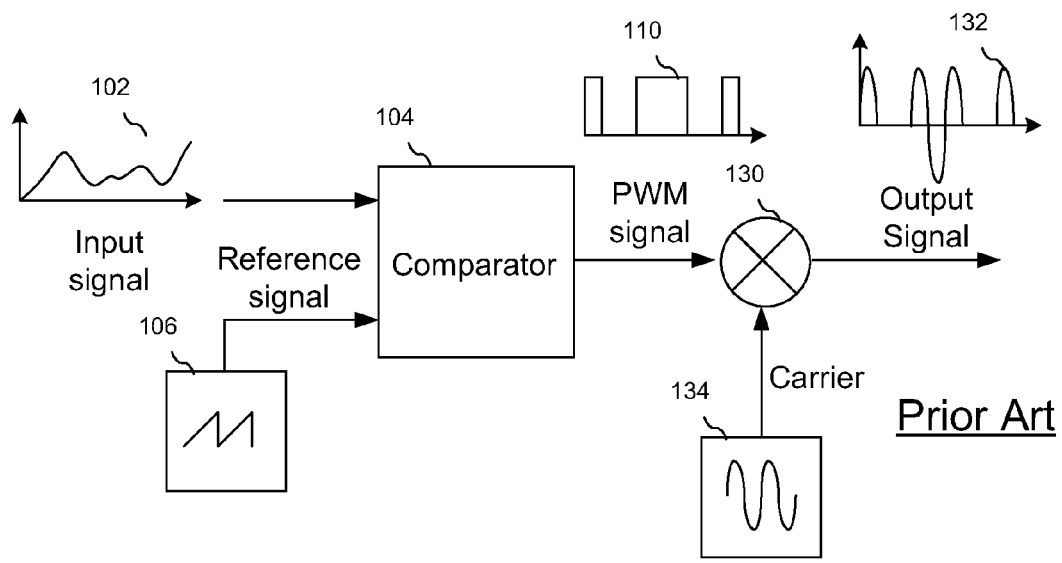

FIG. 1b illustrates representative spectra of the input and output of conventional pulse-width modulator 100 shown in FIG. 1a. Spectrum 120 represents the spectrum of input signal 102, and spectrum 122 represents the spectrum of output 110. Because of the rectangular shape of the PWM signal, the spectrum has a very broad band noise floor 126. Upconverted portions 124 of the input signal also occur at intervals of the PWM frequency. For applications having an RF output, the analog PWM modulator can be interfaced to mixer 130 and oscillator 134 to produce upconverted output signal 132, as shown in FIG. 1c.

Figure 1D:
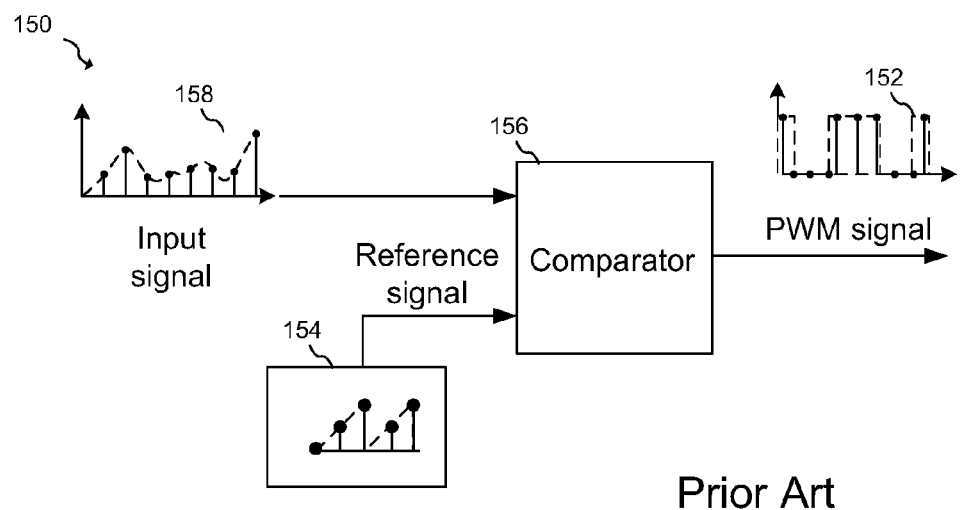

The noise floor and accuracy of the analog PWM modulators, however, is dependent on the quality and accuracy of reference signal 106. In some cases, an analog implementation of an analog PWM modulator requires a complicated and process dependent implementation in order to produce an output PWM signal with a high dynamic range. One way that process dependencies and reference nonlinearities of an analog implementation can be avoided is by implementing PWM modulator 150 in the digital domain as shown in FIG. 1d. Here, digitized input signal 158 is compared with digitized reference signal 154 using comparator 156 to yield digitized PWM signal 152. Because the operation of digital PWM generator 150 occurs at a fixed and finite sampling rate on a fixed time grid, edge transitions in PWM output signal 152 generally do not correspond with the crossing points of an analog PWM implementation. Consequently, quantization noise and distortion is introduced. This quantization noise and distortion can also be viewed in the context of aliasing that occurs because a wideband analog PWM signal is being sampled with a finite sampling rate.

Depending on the sampling rate, aliasing present in a digital implementation can significantly reduce the dynamic range of sampled output signal 152 compared to an analog implementation. For example, if a PWM reference frequency of 100 MHz (frequency of the sawtooth or triangular reference 154) and a PWM sampling frequency of 1 GHz are used, each PWM cycle is quantized into 10 steps resulting in additional noise and aliasing. In some cases, the spurious-free dynamic range of such an implementation can be reduced from 70 dB to about 30 dB, where the spurious-free dynamic range is defined as the ratio between the average signal power and the power of the largest spurious signal component in the band of interest in decibels. It should be appreciated that other dynamic range measures can be used to characterize the performance of embodiment PWM generators.

Figure 1E:
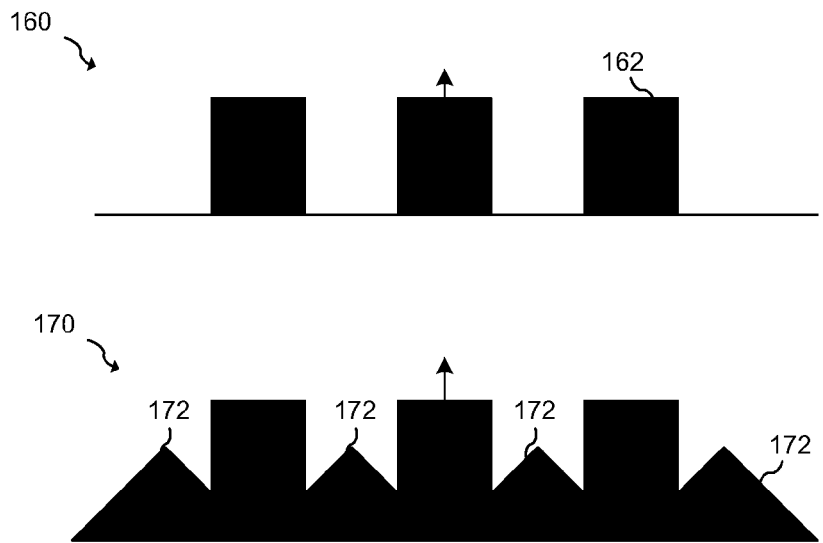

FIG. 1e illustrates representative spectrums 160 and 170 corresponding to sampled input signal 158 and representative output signal 152 of FIG. 1d, respectively. The sampled nature of input signal 158 creates aliased spectral portions 162 in input spectrum 160. Consequently, these aliased portions of the signal are further modulated to create additional spectral energy 172.

This effect is further exasperated if the output signal of digital PWM generator 150 is upconverted to RF frequencies. Since the baseband signal is not band-limited, the modulated baseband signal is distorted at the positive carrier frequency from components stemming from negative carrier frequencies and vice versa. This further reduces the dynamic range around the carrier frequency and degrades modulated input signal. In some, cases portions of this signal quality degradation is conventionally remedied if a multiple of the PWM sampling frequency falls at about the RF carrier frequency.

Another way to conventionally overcome the problem of image distortion in upconverted PWM signals is to use a low-pass filter after the DPWM before the PWM pulses are upconverted to the desired RF carrier frequency. While this may avoid an image problem, aliasing still significantly affects the dynamic range. Increasing the sampling rate of the digital PWM modulator can help alleviate the image problem, however, this sampling rate can become very high. For example, at a 100 MHz PWM frequency, the sampling rate of the PWM pulses would need to be tens of Gigahertz to produce a dynamic range equivalent to a conventional analog implementation.

Figure 2A:
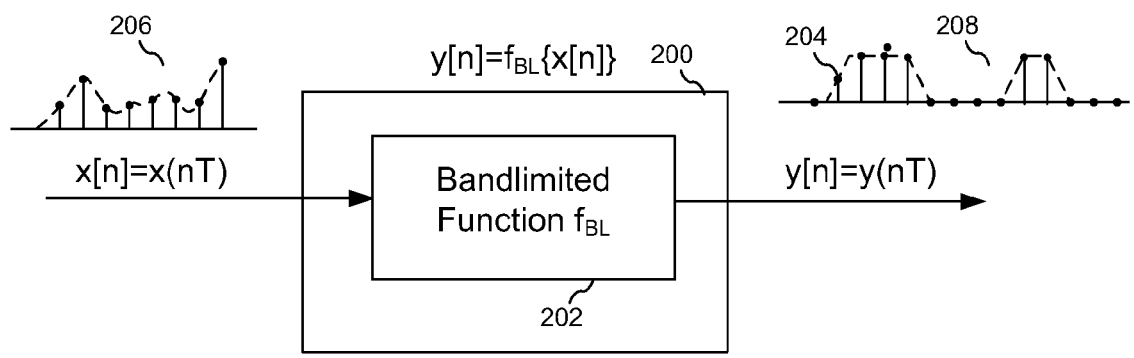
FIGS. 2a-2b illustrate an embodiment PWM modulator and associated spectra.

FIG. 2a illustrates PWM modulator 200 according to an embodiment of the present invention. Band limited function 202 takes digitized input 206 and produces digitized output 208 having a limited harmonic content. Digitalized pulse output 208 is already band limited, as evidenced by sample 204 of intermediate amplitude. In one embodiment, digitized output 208 is calculated by determining the first k Fourier harmonics of a Fourier Series expansion of a PWM signal. Alternatively, any band limited Fourier Series expansion of a PWM signal or other basis functions besides Fourier basis functions, including, but not limited to wavelet, orthogonal polynomials, and radial basis functions can be used. By band limiting the generated PWM function instead of lowpass filtering a generated wideband function, the effect of aliasing degrading the dynamic range of the PWM signal can be greatly reduced or avoided. Modulator 200 can be implemented in a number of ways including, but not limited to using custom and/or standard cell logic on a general purpose and/or application specific integrated circuit, using an programmable processor, or by executing software on a computer system.

Figure 2B:
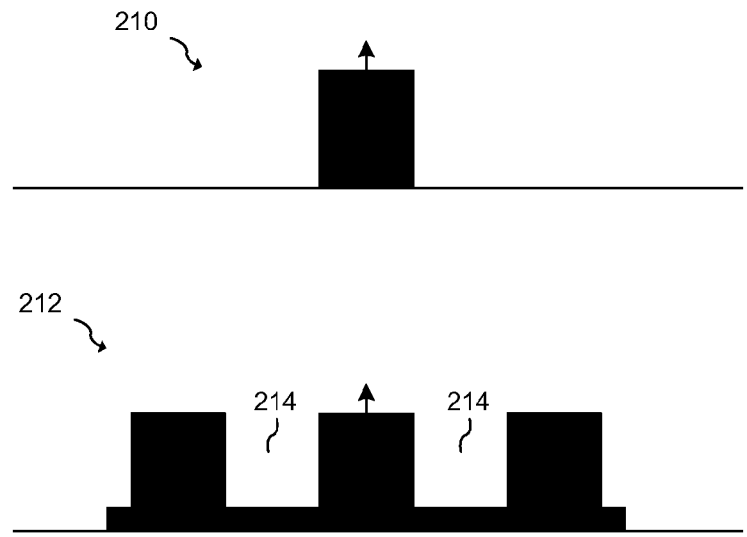

FIG. 2b illustrates representative input and output spectra 210 and 212 corresponding to input digital signal 206 and output digital signal 208, respectively. Here, additional spectral content due to aliasing is not apparent in regions 214 of output spectrum 212 because of the band limited nature of the generated basis functions.

In an embodiment, a band limited kernel can be derived natural-sampling trailing-edge PWMs for input signals x(t) bounded between 0 and 1. The continuous time input-output relationship of such a PWM signal can be written as:

$$y(t) = f\{x(t)\}$$
$$= x(t) + \sum_{k=1}^{\infty} \frac{1}{k\pi}(\sin(2\pi k f_P t) - \sin(2\pi k f_P t - 2\pi k x(t))),$$

where x(t) is the input signal, $f_P$ is the PWM frequency, and y(t) is the pulse-width modulated output signal. From the above equation, it is apparent that the kernel is not band-limited, since y(t) has frequency components approaching infinity when x(t) is non-zero.

The above expression can be expressed in a discrete-time or sampled version where x(nT) is substituted for x(t):

$$y(nT) = f\{x(nT)\}$$
$$= x(nT) + \sum_{k=1}^{\infty} \frac{1}{k\pi}(\sin(2\pi k f_P nT) - \sin(2\pi k f_P nT - 2\pi k x(nT))),$$

where T is the sampling period. In the above equation, aliasing occurs for T>0. Therefore, in some embodiment, the kernel is band-limited by using only k terms instead of all terms:

$$y(nT) = f_{BL}\{x(nT)\}$$
$$= x(nT) + \sum_{k=1}^{K} \frac{1}{k\pi}(\sin(2\pi k f_P nT) - \sin(2\pi k f_P nT - 2\pi k x(nT))).$$

Therefore, for a sufficiently short sampling period T, the aliasing problem is avoided. In embodiments, the PWM signal is generated based on the band-limited kernel from the last equation, where each harmonic k is calculated according to:

$$g_k\{\ \} = \frac{1}{k\pi}(\sin(2\pi k f_P nT) - \sin(2\pi k f_P nT - 2\pi k x(nT))).$$

Figure 3:
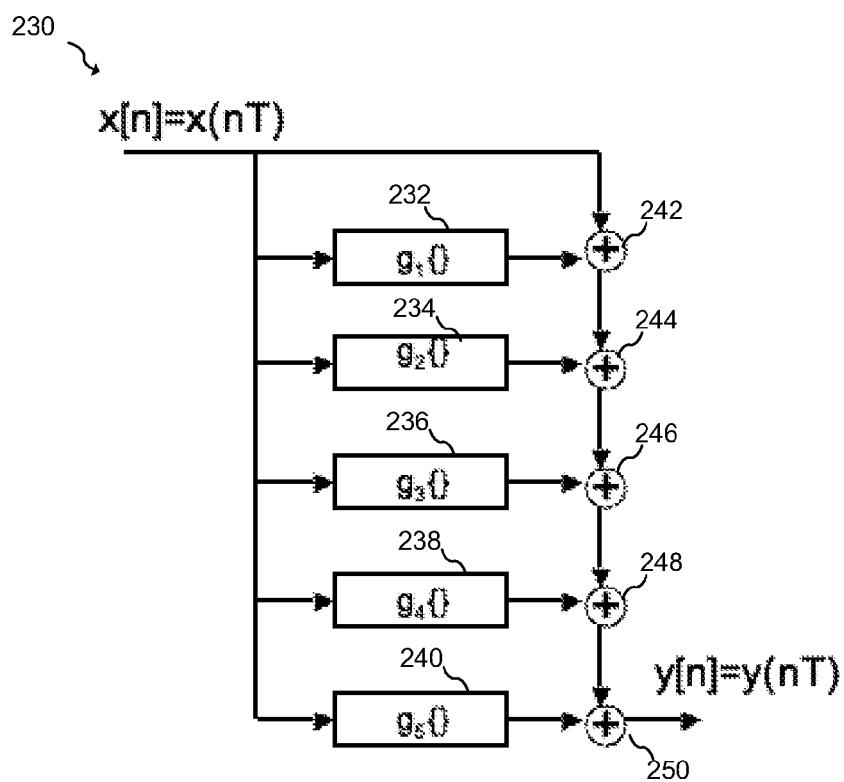
FIG. 3 illustrate an embodiment PWM modulator implementation.

FIG. 3 illustrates an embodiment band limited function generator 230 where k=5, meaning that the PWM signal is generated using the first 5 Fourier harmonics. Blocks 232, 234, 236, 238 and 240 generate functions $g_1\{\ \}$, $g_2\{\ \}$, $g_3\{\ \}$, $g_4\{\ \}$ and $g_5\{\ \}$, respectively. Input signal x(nT) is summed with the outputs of $g_1\{\ \}$, $g_2\{\ \}$, $g_3\{\ \}$, $g_4\{\ \}$ and $g_5\{\ \}$ using summing blocks 242, 244, 246, 248 and 250. It should be appreciated that in alternative embodiments, greater or fewer harmonics than five can be used. It should be further appreciated that function generator 230 shown in FIG. 3 is just one example of show band limited functions can be generated. In alternative embodiments, other functional equivalent structures can be used.

Figure 4:
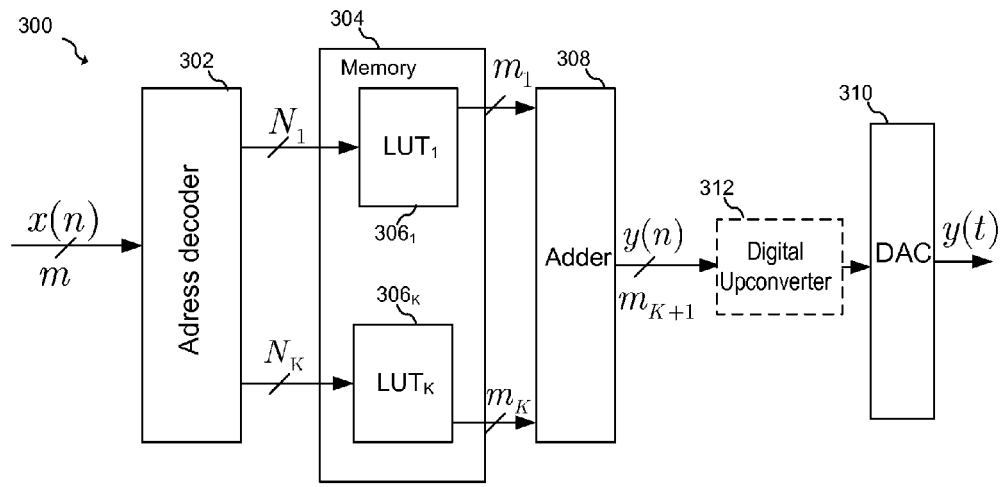
FIG. 4 illustrates a further embodiment PWM modulator implementation.

FIG. 4 illustrates embodiment architecture 300 used to generate embodiment band limited functions. Here, memory 304 having a plurality of lookup tables $306_1$ to $306_k$ on which basis functions $g_k\{\ \}$ is accessed using digital input signal x(n) as an address. Address decoder 302 produces decoded address lines $N_1$ to $N_k$. Adder 308 sums outputs $m_1$ to $m_k$ of memory 304 to form digital output word y(n). In one embodiment, digital output word y(n) is converted into the analog domain via digital-to-analog converter (DAC) 310 to form y(t). In alternative embodiments, further processing, for example, a digital upconversion is performed on digital output word y(n) via optional upconversion block 312 before performing a digital-to-analog conversion. In some embodiments, DAC 310 can be omitted.

In some embodiments, the band limitation of the PWM generator creates an approximation of an ideal PWM signal, which means that the signal contains not only temporal pulse-width information but also amplitude information. Therefore, a DAC with low resolution is used to convert this multi-bit digital signal into the analog domain in some embodiments. Depending on the required signal quality or dynamic range for a particular implementation, a resolution of 7 to 8 bit for a 60 dB to 70 dB dynamic range is sufficient. Alternatively, greater or fewer than 7 of 8 bits can be used depending on the implementation and its specifications.

Figure 5:
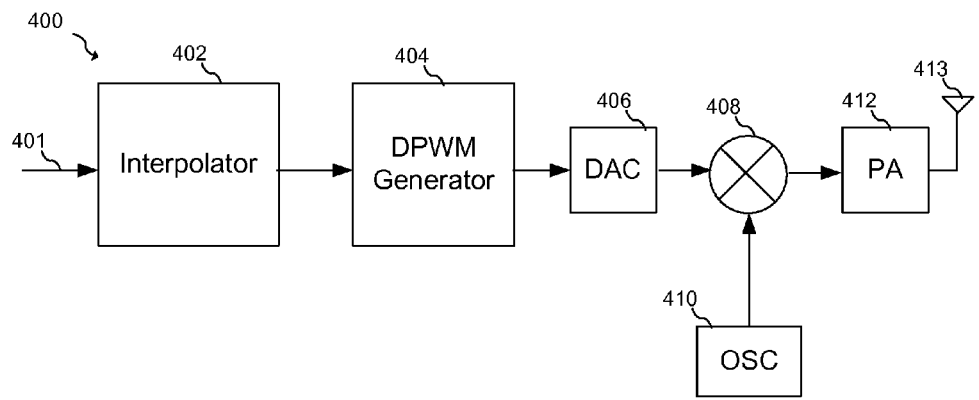
FIG. 5 illustrates an embodiment RF system.

Referring to FIG. 5, an embodiment RF system 400 is shown using DPWM generator 404 implemented according to embodiments described above. In addition, interpolator 402 upsamples digital input 401. DAC 406 converts the output of DPWM generator 404 into the analog domain, and mixer 408 mixes the output of DAC 406 with the output of oscillator 410. The output of mixer 408 is amplifier with power amplifier 412 and transmitted on antenna 413. In some embodiments, additional filtering can be added before and/or after PA 412 to suppress noise and distortion in adjacent channels. In one embodiment, digital input 401 is sampled at a rate of 10 MHz. Interpolator 402 upsamples by 20 to achieve a sampling rate of about 200 MHz. DPWM generator 404 outputs a digital PWM signal at a rate of 200 MHz. Mixer 408 upconverts the output of DAC 406 with a sampling rate of 200 MHz, and the frequency of oscillator 410 is 2 GHz. It should be appreciated that system 400 shown in FIG. 5 is just one example of an embodiment system. Accordingly, in alternative embodiments, other signal path frequency plans and architectures can be used.

Figure 6:
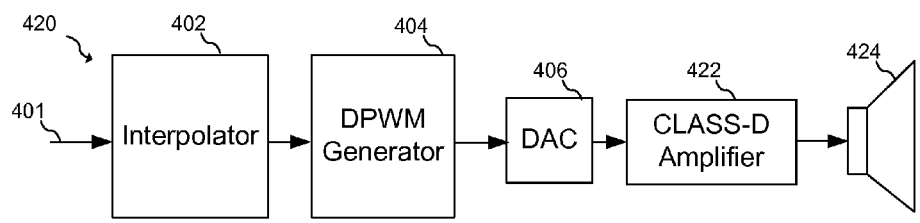
FIG. 6 illustrates an embodiment audio system.

FIG. 6 illustrates embodiment audio system 420 using DPWM generator 404. Similar to the RF embodiment of FIG. 5, interpolator 402 upsamples digital input 401. The output of DAC 406 is coupled to class-D amplifier 422, which drives speaker 424. In an embodiment, In one embodiment, digital input 401 is sampled at a rate of 44 kHz, which is upsampled by a factor of 20 a sampling rate of about 880 kHz. DPWM generator 404 outputs a digital PWM signal at a rate of 880 kHz. Again, system 420 shown in FIG. 6 is just one example of an embodiment system. Therefore, in alternative embodiments, other signal path frequency plans and architectures can be used.

In an embodiment, a method of generating a pulse-width modulated signal from an input signal includes calculating a finite number of basis functions of a first pulse-width modulated signal based on the input signal forming an electronic output based on the calculated finite number of basis functions. In some embodiments, the finite number of basis functions represents a band limited approximation of the first pulse-width modulated signal. Some embodiments, the finite number of basis functions comprise k Fourier Series harmonics of a Fourier Series representation of the first pulse-width modulated signal. For example, calculating the fining number of basis functions can include calculating a first k Fourier Series harmonics according to:

$$g_k\{\ \} = \frac{1}{k\pi}(\sin(2\pi k f_p nT) - \sin(2\pi k f_p nT - 2\pi k x(nT))),$$

where $g_k\{\ \}$ is a time domain representation of a $k^{th}$ basis function, $f_p$ is a pulse-width modulation frequency and x(nT) is the input signal. In some embodiments, k=5, meaning that the first five Fourier Series harmonics of the Fourier Series representation of the first pulse-width modulated signal is calculated.

In an embodiment, the method further includes applying a digital representation of the input signal as an address to a lookup table, and obtaining the calculated finite number of basis functions from the lookup table based on the address. In some embodiments, forming the electronic output signal includes performing an analog to digital conversion on the calculated number of basis functions to obtain a first analog output signal. Furthermore, the method can also include applying the first analog output signal to a first input of a mixer, applying a carrier signal to a second input of the mixer; and obtaining a modulated signal at an output of the mixer. A RF power amplifier can also be coupled to the output of the mixer. In some embodiments, the first analog output signal is applied to an input of a class-D amplifier. This class-D amplifier can drive an acoustic transducer, such as a loudspeaker, or other device.

In an embodiment, a method of providing a pulse-width modulated signal from a digital input signal includes calculating a first k Fourier harmonics of a first pulse-width modulated signal to produce a first digital signal, the first pulse-with modulated signal having a pulse-width proportional to an amplitude of the digital input signal, and forming an electronic output signal based on the first digital signal. In some embodiments, forming the electronic output includes performing a digital upconversion of the first digital signal to a first carrier, and performing an analog to digital conversion of the first upconverted signal. In some cases, forming the electronic output includes performing an analog to digital conversion of the first digital signal to form a first analog signal. Forming the electronic output can also include applying the first analog signal to an input of a mixer, and applying an output of the mixer to an input of a power amplifier. The first analog signal can also be applied to an input of a class-D amplifier. In some embodiments, the method can include upsampling an input signal to form the digital input signal.

In an embodiment, a system for providing a pulse-width modulated signal includes digital pulse-width modulator configured to generate a first plurality of basis functions approximating a pulse-width modulated signal. In some embodiments, pulse-width is proportional to a first digital input signal.

In some embodiments, the first plurality of basis functions comprise the first k Fourier Series harmonics of the pulse-width modulated signal, which are calculated according to:

$$g_k\{\ \} = \frac{1}{k\pi}(\sin(2\pi k f_p nT) - \sin(2\pi k f_p nT - 2\pi k x(nT))),$$

where $g_k\{\ \}$ is a time domain representation of a $k^{th}$ basis function, $f_p$ is a pulse-width modulation frequency and $x(nT)$ is the input signal.

In some embodiments, the system further includes an interpolator coupled to an input of the digital pulse-width modulator, where the interpolator upsamples an input signal to form the first digital input signal. A digital-to-analog converter can be coupled to an output of the digital pulse-width modulator, and/or a class-D amplifier can be coupled to an output of the analog-to-digital converter. In some embodiments, a mixer is coupled to an output of the digital to analog converter.

In an embodiment, an integrated circuit includes a digital pulse-width modulator configured to generate a first k Fourier harmonics approximating a pulse-width modulated signal that has a pulse-width proportional to a first digital input signal. The system also includes, for example, a digital-to-analog converter coupled to an output of the digital pulse-width modulator. In some systems, an interpolator is coupled to an input of the digital pulse-width modulator, where the interpolator upsamples an input signal to form the first digital input signal.

In an embodiment, the digital pulse-width modulator comprises a look-up table generating the first k Fourier harmonics according to the first digital input signal. The look-up table can be implemented as a single look-up table or it can comprise a plurality of look-up tables, where each of the plurality of look-up tables produced a different one of the first k Fourier harmonics.

Advantages of embodiments include the ability to digitally generate pulse-width modulated waveforms having a high dynamic range and low noise floor with a relatively low oversampling rate. For example, in one embodiment, a dynamic range of 70 dB is achievable with a 12× oversampling ratio. A lower oversampling ratio allows for power savings in systems.

With respect to in RF systems in which an embodiment PWM is upconverted to a high frequency, advantageous embodiments include the ability to have a low noise floor in adjacent channels. In some cases, this low adjacent channel noise floor is lower than the out of band noise floor created by PWM systems using noise shaped techniques such as sigma-delta modulators. By having a lower out of band noise floor, output filtering requirements are relaxed, thereby allowing for a flexible system configuration. For example, in some embodiments, the output frequency can be easily changed or reassigned without having to replace an expensive high-order filter, such as a saw filter. In some embodiments, the pulse-width modulated signal can be directly upconverted to an RF frequency without having to resort to using a fixed high-order filter at an intermediate frequency, thereby saving power and cost. Of course, in some embodiments, an intermediate frequency and high order SAW filters could also be used if Specifications dictate. However, the noise and distortion performance of embodiment DPWM generators can potentially relax the requirements of output or IF SAW filters also.

A further advantage of embodiments include the ability to implement high performance digital PWM modulators using a simple digital architecture, for example, a lookup table. Consequently, embodiment circuits can be implemented using standard digital circuits techniques and existing circuits can be migrated to finer geometry processes in a relatively straightforward manner.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of generating a pulse-width modulated signal from an input signal, the method comprising:
    calculating a finite number of basis functions of a first pulse-width modulated signal based on the input signal, wherein the finite number of basis functions represents a frequency band limited approximation of the first pulse-width modulated signal, wherein calculating comprises applying a digital representation of the input signal as an address to a lookup table and obtaining the calculated finite number of basis functions from the lookup table based on the address;
    forming an electronic output signal based on the calculated finite number of basis functions; and
    upconverting the electronic output signal.

2. The method of claim 1, wherein calculating the finite number of basis functions comprise calculating a first k Fourier Series harmonics according to:

$$g_k\{\ \} = \frac{1}{k\pi}(\sin(2\pi k f_p nT) - \sin(2\pi k f_p nT - 2\pi k x(nT))),$$

where $g_k\{\ \}$ is a time domain representation of a $k^{th}$ basis function, $f_p$ is a pulse-width modulation frequency and $x(nT)$ is the input signal.

3. The method of claim 1, wherein the finite number of basis functions comprise k Fourier Series harmonics of a Fourier Series representation of the first pulse-width modulated signal.

4. The method of claim 3, wherein the k Fourier Series harmonics comprises a first five Fourier Series harmonics of the Fourier Series representation of the first pulse-width modulated signal.

5. The method of claim 1, wherein forming the electronic output signal comprises performing a digital to analog conversion on the calculated finite number of basis functions to obtain a first analog output signal.

6. The method of claim 5, wherein upconverting the electronic output signal comprises:
    applying the first analog output signal to a first input of a mixer;
    applying a carrier signal to a second input of the mixer; and
    obtaining a modulated signal at an output of the mixer.

7. The method of claim 6, further comprising driving an RF power amplifier coupled to the output of the mixer.

8. The method of claim 5, further comprising applying the first analog output signal to an input of a class-D amplifier.

9. The method of claim 8, further comprising driving a loudspeaker with an output of the class-D amplifier.

10. A method of providing a pulse-width modulated signal from a digital input signal, the method comprising:
    calculating a first k Fourier harmonics of a first pulse-width modulated signal to produce a first digital signal, wherein the first pulse-width modulated signal has a pulse-width proportional to an amplitude of the digital input signal, and k is finite, wherein calculating the first k Fourier harmonics comprises using a lookup table to produce the first digital signal based on the digital input signal; and forming an electronic output signal based on the first digital signal, wherein forming the electronic output signal comprises performing an upconversion of the first digital signal.

11. The method of claim 10, wherein:

performing the upconversion comprises performing a digital upconversion of the first digital signal to a first carrier to form a first upconverted signal; and forming the electronic output signal further comprises performing a digital to analog conversion of the first upconverted signal.

12. The method of claim 10, wherein forming the electronic output signal further comprises:

performing a digital to analog conversion of the first digital signal to form a first analog signal.

13. The method of claim 12, wherein performing the upconversion comprises:

applying the first analog signal to an input of a mixer; and applying an output of the mixer to an input of a power amplifier.

14. The method of claim 12, wherein forming the electronic output signal further comprises applying the first analog signal to an input of a class-D amplifier.

15. The method of claim 12, further comprising upsampling an input signal to form the digital input signal.

16. A system for providing a pulse-width modulated signal, the system comprising:

a digital pulse-width modulator configured to generate a finite first plurality of frequency band limited basis functions approximating a first pulse-width modulated signal having a pulse-width proportional to a first digital input signal, wherein the digital pulse-width modulator comprises a lookup table configured to generate the finite first plurality of frequency band limited basis functions based on the first digital input signal; and an upconverter coupled to an output of the lookup table.

17. The system of claim 16, wherein the first plurality of basis functions comprise a first k Fourier Series harmonics of the first pulse-width modulated signal.

18. The system of claim 17, wherein the first k Fourier Series harmonics are calculated according to:

$$g_k\{\ \} = \frac{1}{k\pi}(\sin(2\pi k f_p nT) - \sin(2\pi k f_p nT - 2\pi k x(nT))),$$

where $g_k\{\ \}$ is a time domain representation of a $k^{th}$ basis function, $f_p$ is a pulse-width modulation frequency and $x(nT)$ is the input signal.

19. The system of claim 16, further comprising an interpolator coupled to an input of the digital pulse-width modulator, the interpolator upsampling an input signal to form the first digital input signal.

20. The system of claim 16, comprising a digital-to-analog converter coupled to an output of the digital pulse-width modulator.

21. The system of claim 20, further comprising a class-D amplifier coupled to an output of the digital-to-analog converter.

22. The system of claim 20, wherein the upconverter comprises a mixer coupled to an output of the digital to analog converter.

23. An integrated circuit comprising:

a digital pulse-width modulator configured to generate a first k Fourier harmonics approximating a pulse-width modulated signal have a pulse-width proportional to a first digital input signal wherein k is finite, wherein the digital pulse-width modulator comprises a look-up table configured to generate the first k Fourier harmonics according to the first digital input signal;

a digital-to-analog converter coupled to an output of the digital pulse-width modulator; and an upconverter coupled to the output of the digital-to-analog converter.

24. The integrated circuit of claim 23, further comprising an interpolator coupled to an input of the digital pulse-width modulator, the interpolator upsampling an input signal to form the first digital input signal.

25. The integrated circuit of claim 23, wherein the look-up table comprises a plurality of look-up tables, each of the plurality of look-up tables producing a different one of the first k Fourier harmonics.

* * * * *